US010038315B2

(12) United States Patent
Sumida

(10) Patent No.: US 10,038,315 B2
(45) Date of Patent: Jul. 31, 2018

(54) CIRCUIT ASSEMBLY AND ELECTRICAL JUNCTION BOX

(71) Applicants:AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventor: Tatsuya Sumida, Mie (JP)

(73) Assignees: Sumitomo Wiring Systems, Ltd., Yokkaichi-shi, Mie (JP); AutoNetworks Technologies, Ltd., Yokkaichi-shi, Mie (JP); Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 15/543,585

(22) PCT Filed: Dec. 28, 2015

(86) PCT No.: PCT/JP2015/086479
§ 371 (c)(1),
(2) Date: Jul. 14, 2017

(87) PCT Pub. No.: WO2016/114099
PCT Pub. Date: Jul. 21, 2016

(65) Prior Publication Data
US 2018/0006441 A1 Jan. 4, 2018

(30) Foreign Application Priority Data
Jan. 16, 2015 (JP) ................................. 2015-006685

(51) Int. Cl.
*H01R 12/00* (2006.01)
*H02G 3/16* (2006.01)
(Continued)

(52) U.S. Cl.
CPC ............. *H02G 3/16* (2013.01); *H05K 1/0209* (2013.01); *H05K 7/205* (2013.01);
(Continued)

(58) Field of Classification Search
CPC .. H02G 3/16; H05K 2201/066; H05K 1/0204; H05K 1/056; H05K 1/0209;
(Continued)

(56) References Cited

U.S. PATENT DOCUMENTS 3,514,538 A * 5/1970 Chadwick .............. H05K 1/056
156/150
4,376,287 A * 3/1983 Sechi ...................... H01L 23/15
257/664
(Continued)

FOREIGN PATENT DOCUMENTS

JP 401050592 * 2/1989 ............... H05K 1/05
JP 2003-164039 A 6/2003
(Continued)

OTHER PUBLICATIONS

Search Report for International Application No. PCT/JP2015/086479, dated Mar. 15, 2016, 4 pp.

*Primary Examiner* — Jean F Duverne
(74) *Attorney, Agent, or Firm* — Honigman Miller Schwartz and Cohn LLP

(57) ABSTRACT

Provided is a circuit assembly that enables suppression of a decrease in heat dissipation properties. A circuit assembly includes a circuit board having a conductive path, a heat dissipation member on which the circuit board is placed, and an insulating layer that is interposed between the circuit board and the heat dissipation member. A surface of the heat dissipation member that faces the circuit board is a rough surface having protrusions and recessions, and the circuit board and the heat dissipation member are fixed to each
(Continued)

other by the insulating layer penetrating the protrusions and recessions of the rough surface.

9 Claims, 13 Drawing Sheets

(51) Int. Cl.
*H05K 7/20* (2006.01)
*H05K 1/02* (2006.01)
(52) U.S. Cl.
CPC ..... *H05K 7/20409* (2013.01); *H05K 7/20418* (2013.01); *H05K 7/20854* (2013.01); *H05K 1/0204* (2013.01); *H05K 2201/066* (2013.01)
(58) Field of Classification Search
CPC .............. H05K 7/20854; H05K 7/205; H05K 7/20409; H05K 7/20418; F28D 15/0241; H01L 23/15; H01L 23/5389
USPC ....................................................... 439/76.2
See application file for complete search history.

(56) References Cited

U.S. PATENT DOCUMENTS

| 7,399,919 | B2* | 7/2008 | McCutcheon | F28D 15/0241 |
| | | | | 174/16.3 |
| 2003/0137813 | A1 | 7/2003 | Onizuka et al. | |
| 2005/0099778 | A1* | 5/2005 | Nakanishi | H05K 3/0061 |
| | | | | 361/704 |
| 2007/0076391 | A1* | 4/2007 | Hsu | H01L 23/5389 |
| | | | | 361/763 |
| 2015/0230352 | A1 | 8/2015 | Hashikura | |

FOREIGN PATENT DOCUMENTS

| JP | 2005-151617 A | 6/2005 |
| JP | 2007-028856 A | 2/2007 |
| JP | 2014-057390 A | 3/2014 |

* cited by examiner

CIRCUIT ASSEMBLY AND ELECTRICAL JUNCTION BOX

CROSS-REFERENCE TO RELATED APPLICATIONS

This application is the U.S. national stage of PCT/JP2015/086479 filed Dec. 28, 2015, which claims priority of Japanese Patent Application No. JP 2015-006685 filed Jan. 16, 2015.

FIELD OF THE INVENTION

The present invention relates to a circuit assembly and an electrical junction box.

BACKGROUND

Conventionally, circuit assemblies are known in which a board which has conductive paths formed on an insulating plate and to which busbars are bonded is placed on a heat dissipation member. In a circuit assembly disclosed in JP 2005-151617A, a circuit member formed by bonding a plurality of busbars to a control circuit board and mounting electronic components thereon is bonded to a heat dissipation member by, in a state in which an adhesive is applied on top of the heat dissipation member, pressing the circuit member placed on the adhesive against the heat dissipation member.

In JP 2005-151617A, during bonding of the circuit member to the heat dissipation member, the circuit member is pressed against the heat dissipation member. There is a problem in that when the circuit member is pressed against the heat dissipation member, if the pressure applied to the adhesive via the circuit member is nonuniform, the adhesion of the adhesive will be insufficient depending on the location, resulting in a decrease in heat dissipation properties.

The present invention was accomplished based on the above-described circumstances, and it is an object thereof to provide a circuit assembly that enables suppression of a decrease in heat dissipation properties.

SUMMARY OF INVENTION

A circuit assembly according to the present invention includes a circuit board having a conductive path; a heat dissipation member on which the circuit board is placed; and an insulating layer that is interposed between the circuit board and the heat dissipation member, wherein a surface of the heat dissipation member that faces the circuit board is a rough surface having protrusions and recessions, and the circuit board and the heat dissipation member are fixed to each other by the insulating layer penetrating the protrusions and recessions of the rough surface.

With the present configuration, as a result of the insulating layer hardening on the rough surface of the heat dissipation member, the insulating layer penetrates the protrusions and recessions of the rough surface and is secured on top of the heat dissipation member. Since the circuit board is placed and fixed on top of this insulating layer, the circuit board and the heat dissipation member can be fixed to each other via the insulating layer. Thus, the circuit board and the heat dissipation member can be fixed to each other without using an adhesive, and therefore, unlike a case where bonding is performed using an adhesive, it is possible to suppress a decrease in heat dissipation properties that will occur when adhesion of the adhesive between the circuit board and the heat dissipation member is insufficient depending on the location.

The following embodiments are preferred as embodiments of the present invention.

The rough surface may be formed by chemical processing or laser processing.

With this configuration, it is possible to form a rough surface having enough protrusions and depressions to allow the insulating layer to be secured.

The circuit board may be fastened to the insulating layer with a fixing member.

Compared with a case where the circuit board is directly fixed to the heat dissipation member, the fixing member can be made smaller, and the stress that will be produced in the circuit board during fixation with the fixing member can be reduced, so that it is possible to suppress a soldering defect that will occur due to the stress during the fixation working on a soldered portion.

A fixed portion for fixation of a terminal of the circuit board with the fixing member may be formed in the insulating layer.

With this configuration, since the fixed portion that needs insulating properties is formed in the insulating layer, the number of components can be reduced when compared with a case where the fixed portion is formed as a separate component.

A connector housing in which a terminal of the circuit board is accommodated may be formed in the insulating layer.

With this configuration, since the connector housing that needs insulating properties is formed in the insulating layer, the number of components can be reduced when compared with a case where the connector housing is formed as a separate component.

Electronic components constituted by a plurality of low-heat generating components and a plurality of high-heat generating components that generate more heat than the plurality of low-heat generating components may be mounted on the circuit board, and a heat insulating groove may be formed in the circuit board and the insulating layer at a location between the plurality of low-heat generating components and the plurality of high-heat generating components, the heat insulating groove passing through the circuit board and the insulating layer.

With this configuration, heat transfer from the high-heat generating components to the low-heat generating components side via the circuit board and the insulating layer can be suppressed by the heat insulating groove.

A heat dissipation grease may be disposed in a region which is located between the circuit board and the insulating layer and over which at least one of the plurality of high-heat generating components is disposed.

With this configuration, heat conductivity between the circuit board and the insulating layer can be increased by the heat dissipation grease, so that heat of the high-heat generating components can be efficiently conducted to the heat dissipation member.

The heat dissipation member may be formed in a region in which the plurality of high-heat generating components are mounted, without overlapping a region in which the plurality of low-heat generating components are mounted.

With this configuration, the heat dissipation member is made smaller, so that the configuration of the circuit assembly can be simplified. Also, heat of the region on the high-heat generating components side, where a large amount of heat is generated, can be dissipated from the heat dissipation member.

An electrical junction box includes the circuit assembly and a case that accommodates the circuit assembly.

DETAILED DESCRIPTION OF THE PREFERRED EMBODIMENTS

An embodiment of the present invention will be described with reference to FIGS. 1 to 8.

An electrical junction box 10 is disposed, for example, on a power supply path between a power supply such as a battery of a vehicle and loads constituted by in-vehicle electrical equipment, such as a lamp and a wiper, and a motor, and can be used for, for example, a DC-DC converter, an inverter, or the like. An upper-lower direction and a left-right direction in the following description are based on those directions in FIG. 1.

Electrical Junction Box 10

Figure 1:
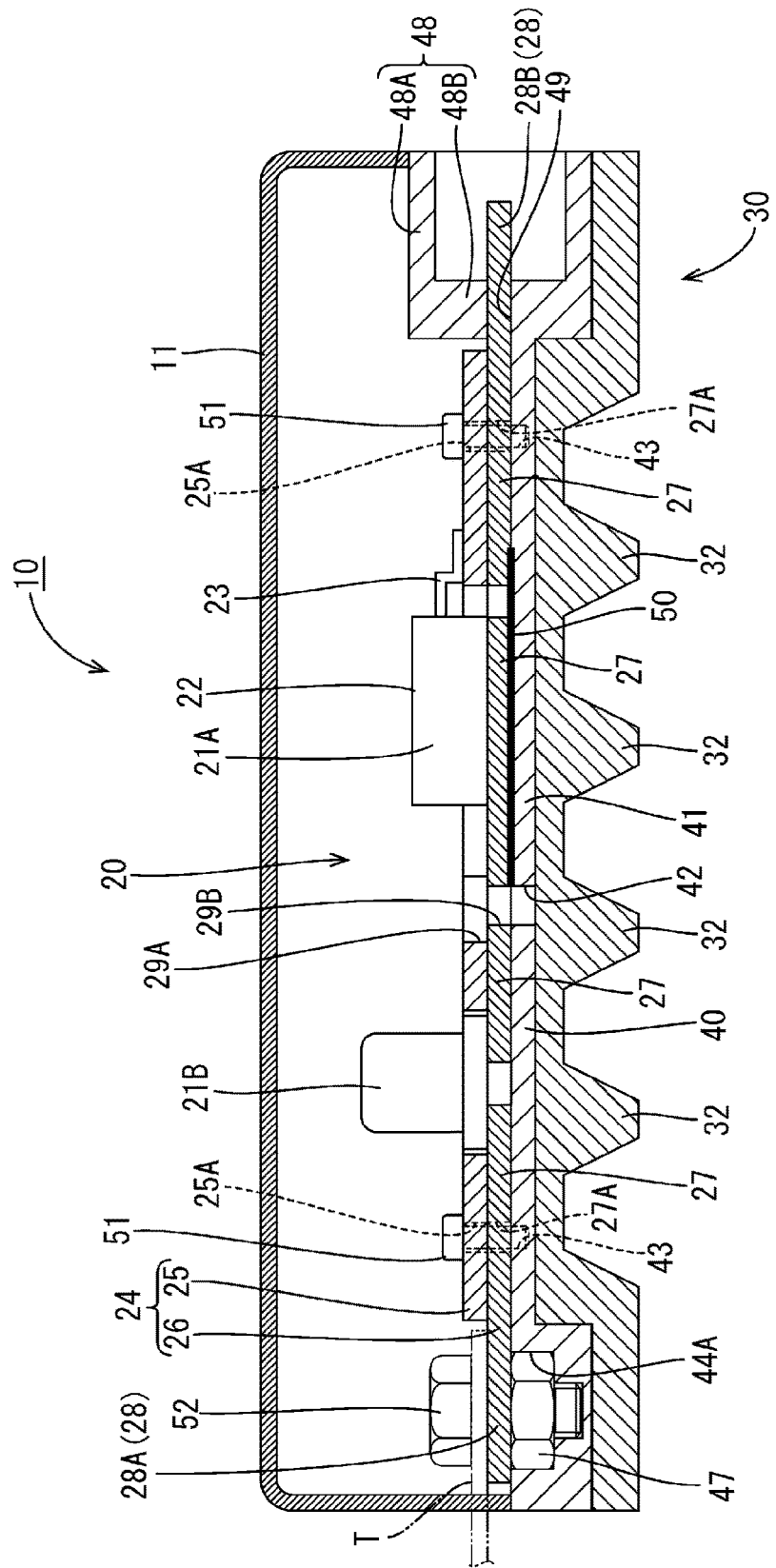
FIG. 1 is a vertical cross-sectional view showing an electrical junction box of Embodiment 1.

As shown in FIG. 1, the electrical junction box 10 includes a circuit assembly 20 and a case 11 that covers the circuit assembly 20. The case 11 is box-shaped and can be formed of, for example, metal such as aluminum, a synthetic resin, or the like.

Circuit Assembly 20

The circuit assembly 20 includes a circuit board 24 on which a plurality of electronic components 21A and 21B are mounted, a heat dissipation member 30 that is laid under the circuit board 24, and an insulating layer 40 that is sandwiched between the circuit board 24 and the heat dissipation member 30 while being secured to an upper surface (surface that faces the circuit board 24) of the heat dissipation member 30.

The plurality of electronic components 21A and 21B include a low-heat generating component 21B and a high-heat generating component 21A that generates more heat than the low-heat generating component 21B. The low-heat generating component 21B is constituted by, for example, a capacitor (aluminum electrolytic capacitor or the like). The high-heat generating component 21A is constituted by, for example, a switching element (FET (Field Effect Transistor) or the like), a resistor, a coil, or the like. Each of the electronic components 21A and 21B has a main body 22 and a plurality of lead terminals 23 that are led from the main body 22. Note that the electronic components 21A and 21B may also be electronic components other than those described above. Moreover, for example, the electronic components 21A and 21B are not limited to those in which lead terminals 23 are led from a main body 22, and may also be leadless terminals having no lead terminals 23. For example, all of the terminals may be formed on the surface of the main body 22.

Circuit Board 24

The circuit board 24 has, for example, a rectangular shape and is configured by bonding an insulating board 25 and a busbar board 26 to each other using an adhesive member (e.g., a pressure-sensitive adhesive tape, an adhesive sheet, an adhesive, or the like). In the insulating board 25, conductive paths (not shown) made of copper foil are formed on an insulating plate made of an insulating material and having a small thickness using printed wiring.

The insulating board 25 has a plurality of circular through holes 25A for fastening the insulating board 25 to the insulating layer 40 with screws 51, the through holes 25A passing through the insulating board 25. The plurality of through holes 25A are formed, for example, at positions (e.g. four corner positions) that are close to peripheral edge portions of the circuit board 24 (on an outer side of the electronic components 21A and 21B); however, the positions at which the through holes 25A are formed are not limited to these positions, and the through holes 25A may also be formed at other positions.

The busbar board 26 is constituted by a plurality of busbars 27 that are arranged in the same plane, spaced apart from one another, and is formed by punching a metal plate material made of copper, a copper alloy, or the like in accordance with the shape of the conductive paths. The busbar board 26 has a plurality of circular through holes 27A for fastening with screws, the through holes 27A passing through the busbar board 26 at positions that are continuous with the respective through holes 25A of the insulating board 25. Terminals 28 that are connectable to external terminals and the like are provided at end portions of the plurality of busbars 27 and protrude outward from peripheral edges of the insulating board 25. The terminals 28 extend flush with the surface of the busbar board 26, and include a power supply input portion 28A that is connected to a terminal T of a terminal portion of a wire on an external power supply side, a connector terminal 28B that is led into a connector housing 48, and a terminal (not shown) that is connected to a winding of a coil.

Heat insulating grooves 29A and 29B are formed in the insulating board 25 and the plurality of busbars 27, respectively, passing therethrough at a location between the high-heat generating component 21A and the low-heat generating component 21B. The heat insulating grooves 29A and 29B extend for a certain length in a direction that is orthogonal to a direction connecting the low-heat generating component 21B and the high-heat generating component 21A. The lengths and the widths of the heat insulating grooves 29A and 29B are set to such dimensions that make it possible to suppress heat transfer from the high-heat generating component 21A to the low-heat generating component 21B. In the present embodiment, for example, the lengths of the heat insulating grooves 29A and 29B are set to be larger than the length of a side surface of the main body 22 in a direction along the heat insulating grooves 29A and 29B, so that heat transfer from the entire side surface of the main body 22 can be suppressed. With regard to the high-heat generating component 21A, the lead terminals 23 are soldered to the conductive paths of the insulating board 25, and a terminal (not shown) at a bottom surface of the main body 22 of this electronic component 21A is soldered to an upper surface of a corresponding one of the busbars 27. With regard to the low-heat generating component 21B, a pair of terminals (not shown) at a bottom surface thereof are soldered to the upper surface of corresponding ones of the busbars 27 and connect the adjacent busbars 27 to each other.

Heat Dissipation Member 30

Figure 3:
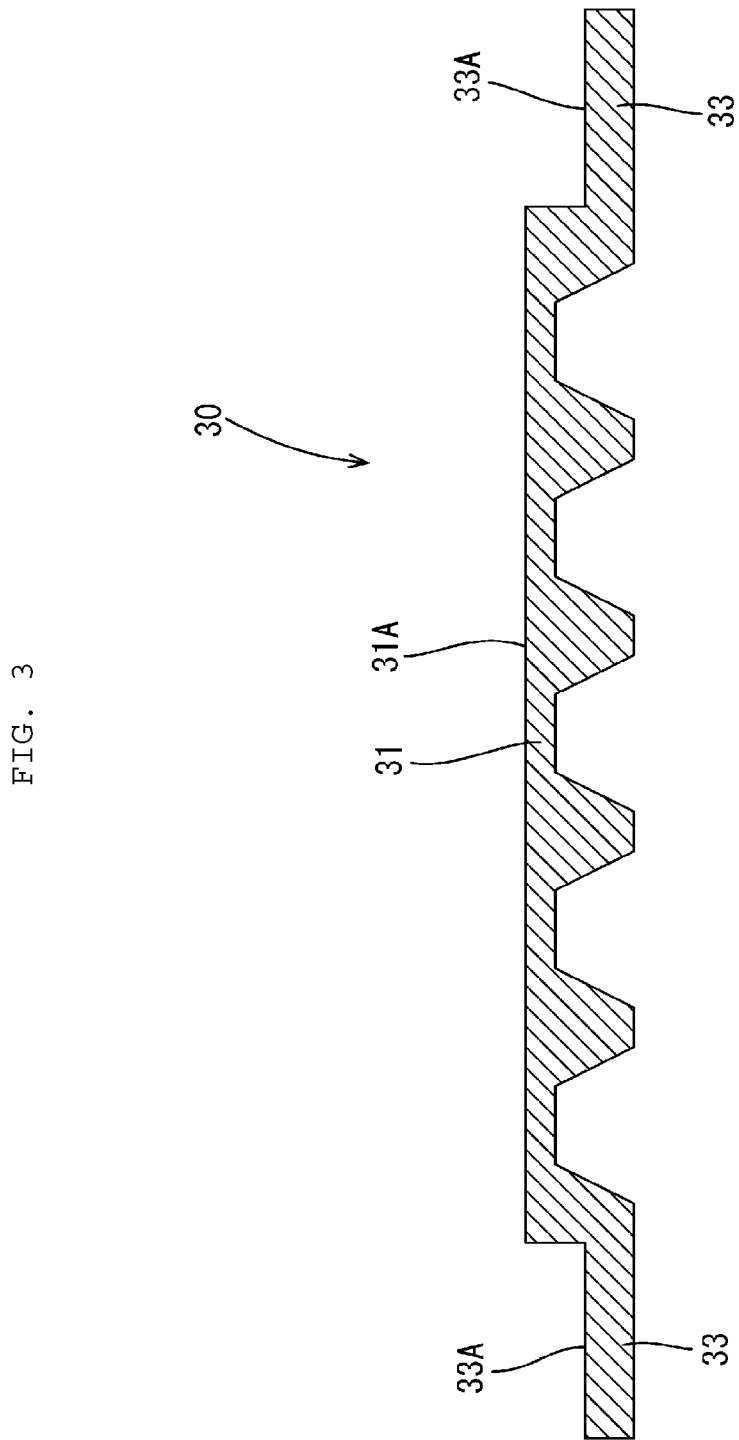
FIG. 3 is a vertical cross-sectional view showing a heat dissipation member.

The heat dissipation member 30 is, for example, made of a metal having high heat conductivity, such as aluminum or an aluminum alloy, and is shaped through aluminum die casting or the like. As shown in FIG. 3, the heat dissipation member 30 has a main body portion 31 on a lower surface side of which a plurality of heat dissipation fins 32 are lined up like comb teeth, and depressed portions 33 which are formed on both sides of the main body portion 31 with respect to the left-right direction and the upper surface side of which is depressed.

Figure 2:
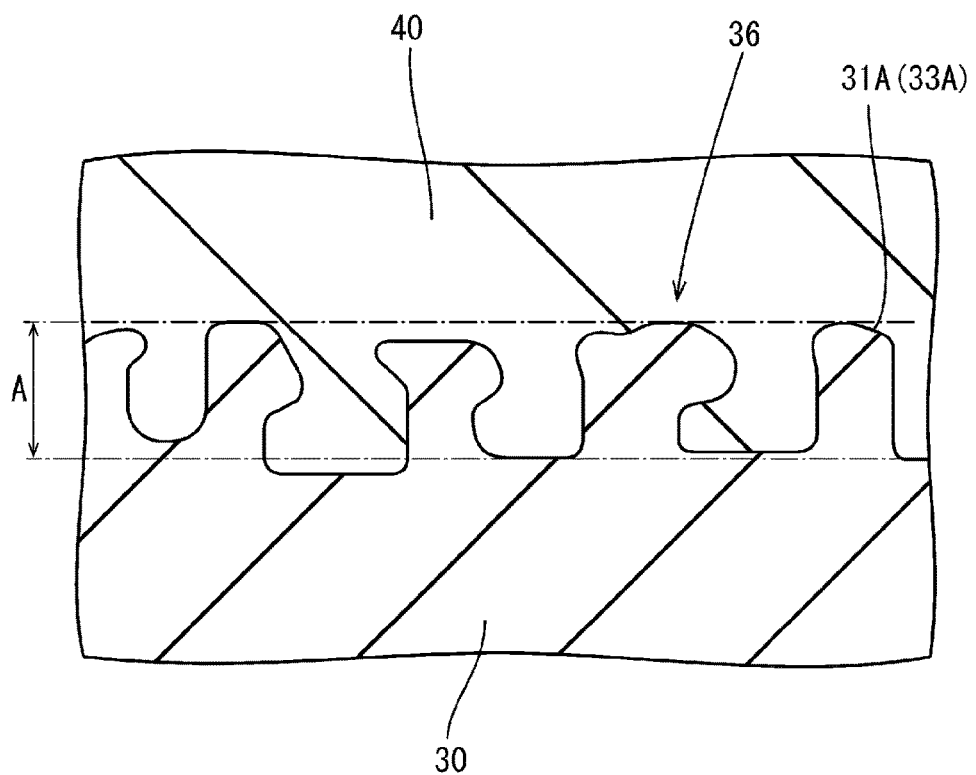
FIG. 2 is a vertical cross-sectional view showing a rough surface in an enlarged manner.

As shown in FIG. 2, an upper surface (upper surface 31A of the main body portion 31 and upper surfaces 33A of the depressed portions 33) of the heat dissipation member 30 constitutes a rough surface 36 that is formed to be rough, having a large number of protrusions and recessions over the entire surface. For example, the rough surface 36 has such protrusions and recessions that have a protruding dimension (height) of 2 to 4 µm and an overhanging shape, and includes protrusions that are formed to have shapes that are wider on their leading end side than on their base end side.

This rough surface 36 is formed by, for example, laser processing, chemical processing, sandblasting, or other processing. Laser processing can be performed by using, for example, a fixed laser such as a YAG laser, a gas laser such as a carbon dioxide gas laser, a semiconductor laser, or the like. Chemical processing can be performed by, for example, etching using hydrochloric acid, nitric acid, hydrofluoric acid, or the like. Note that the method for forming the rough surface is not limited to the above-described methods, and other known methods may also be used.

Figure 5:
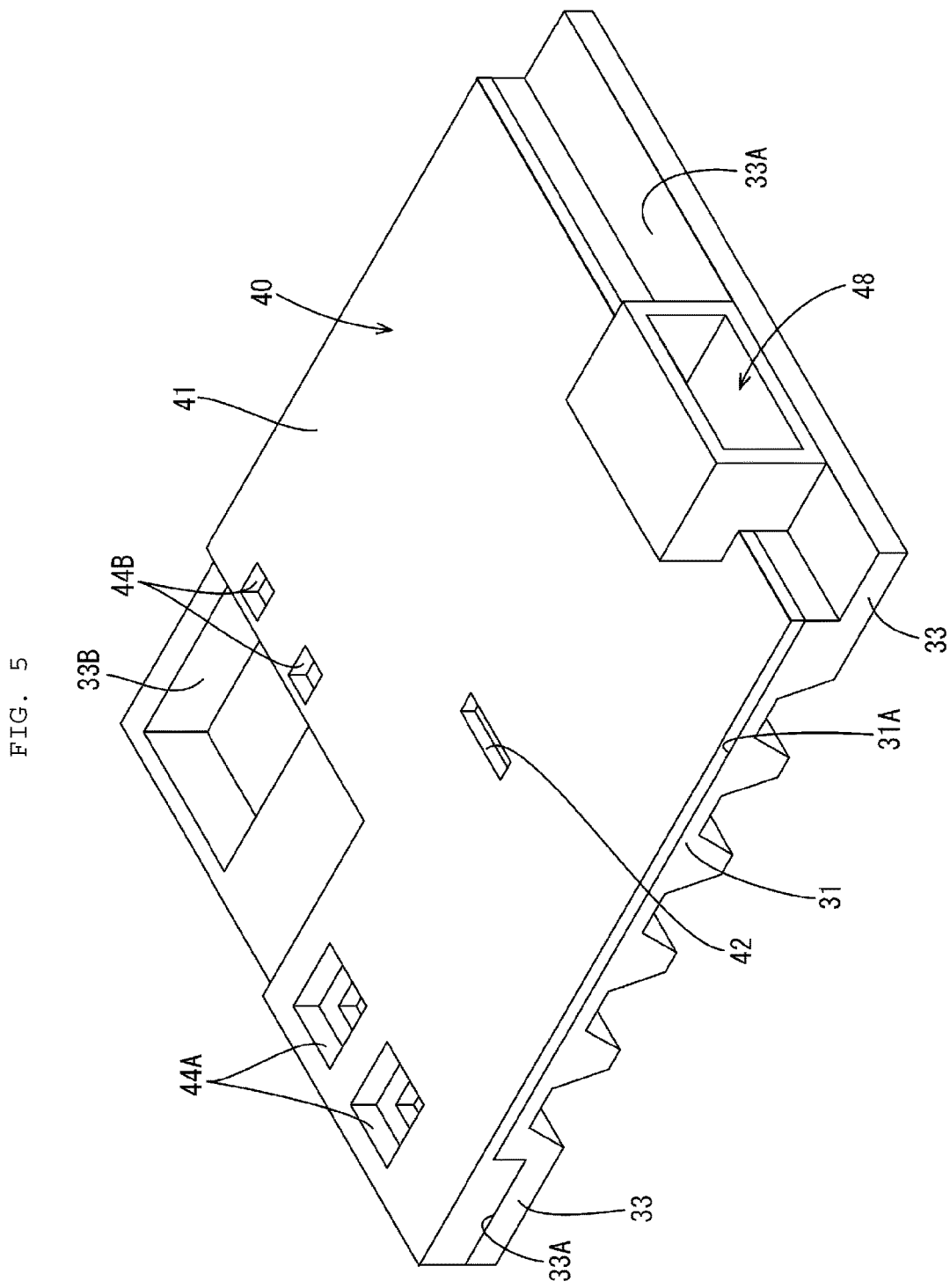
FIG. 5 is a perspective view showing a state in which an insulating layer is formed on the heat dissipation member.

The depressed portions 33 are each formed such that the upper surface side thereof is depressed from the main body portion 31 in a step-like manner. As shown in FIG. 5, a fitting recess 33B into which a core of a coil that has a winding and the core is to be fitted is formed in the depressed portion 33. Fastening portions 44A and 44B and the connector housing 48, which will be described later, are disposed in the insulating layer 40 at locations on the depressed portions 33.

Insulating Layer 40

The insulating layer 40 is formed by curing a resin such as an adhesive in viscous or liquid form, and a material having high heat conductivity and also having insulating properties is used. For example, an epoxy adhesive that cures at a normal temperature can be used. Note that the insulating layer is not limited to this, and various materials can be used. For example, a thermosetting resin, a thermoplastic resin, and the like may also be used.

The insulating layer 40 is formed on and is in intimate contact with the rough surface 36 of the heat dissipation member 30, and includes a main insulating portion 41 that is formed on the main body portion 31 and that has a substantially constant thickness as well as the fastening portions 44A and 44B and the connector housing 48 that are formed on the terminal 28 sides. The circuit board 24 is placed on the main insulating portion 41, and a heat insulating groove 42 is recessed in the main insulating portion 41 at a location between the high-heat generating component 21A and the heat generating component 21B. The heat insulating groove 42 is formed at a position that is underneath and continuous with the heat insulating grooves 29A and 29B, and has substantially the same length as the heat insulating grooves 29A and 29B.

Figure 8:
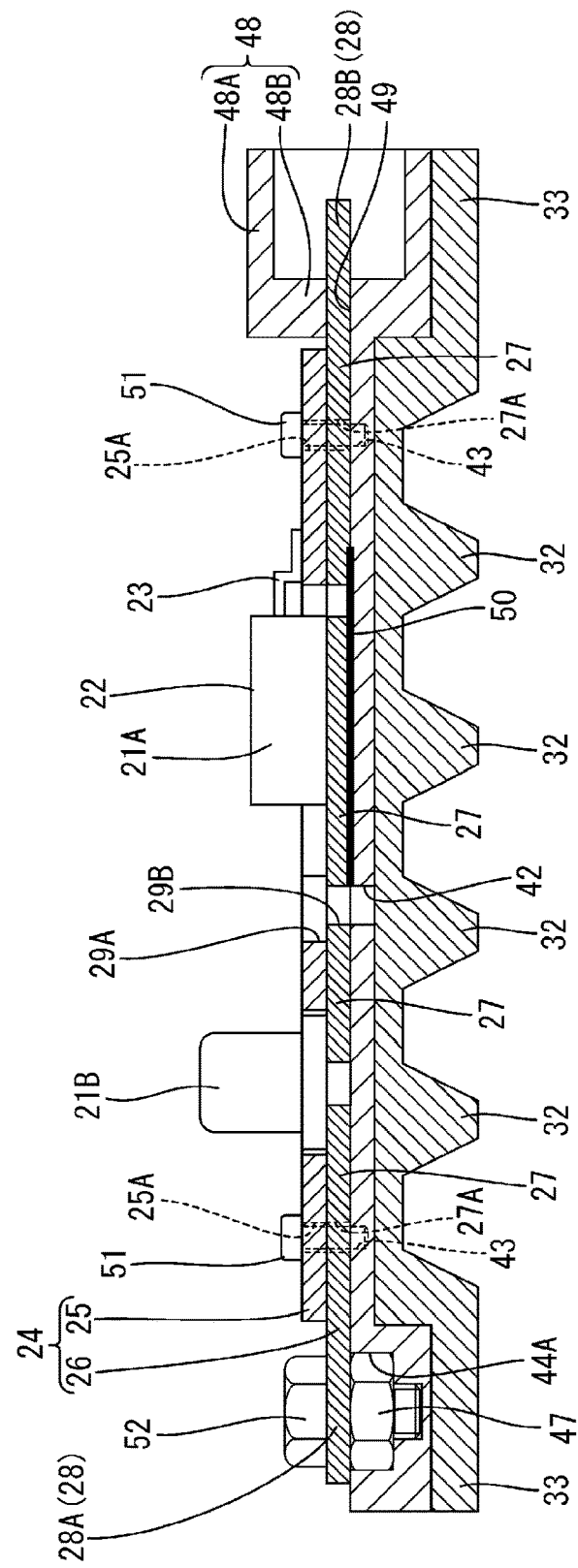
FIG. 8 is a vertical cross-sectional view showing a circuit assembly.
Figure 13:
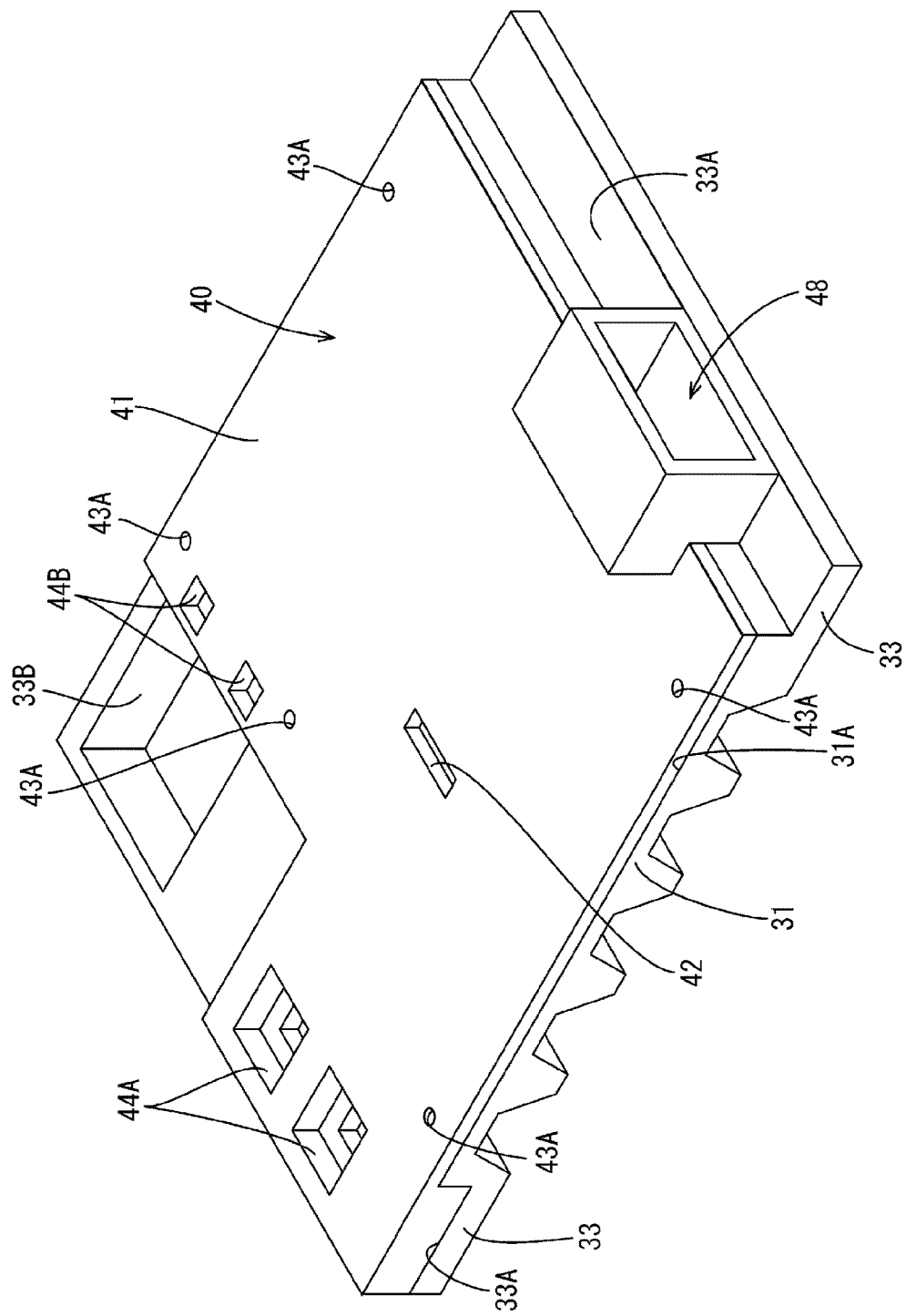
FIG. 13 is a perspective view showing another embodiment in which an insulating layer is formed on a heat dissipation member.

As shown in FIG. 8, the insulating layer 40 has a plurality of fastening holes 43 for fastening with the screws 51, the fastening holes 43 being formed at positions that are underneath and continuous with the respective through holes 25A and 27A. The fastening holes 43 are not formed prior to fastening with the screws, and are configured to be formed by leading end portions of the screws 51 during fastening with the screws. However, the present invention is not limited to this configuration, and as shown in FIG. 13, it is also possible to form threaded slots 43A in advance and perform fastening with the screws 51 by mating shaft portions of the screws with the threads. Note that the screws 51 fasten the circuit board 24 and the insulating layer 40 to each other, but do not fasten the circuit board 24 and the heat dissipation member 30 to each other.

The fastening portions 44A and 44B are the portions for fastening of the terminals 28 of the circuit board 24 with the screws, and include the fastening portions 44A for fastening the terminals 28 to terminal portions of the winding of the coil with the screws and the fastening portions 44B for connecting the terminals 28 to terminals that are connected to terminal portions of external wires. The fastening portions 44A and 44B are recesses into which nuts 47 formed in the upper surface of the insulating layer 40 are press-fitted, and each have a shape that restricts rotation of a corresponding one of the nuts 47 and that receives a leading end of a shaft portion of a corresponding screw 52 (bolt) without coming into contact therewith.

The power supply input portion 28A, which is a terminal of the circuit board 24, is disposed on the nut 47 accommodated in a corresponding one of the fastening portions 44A, and the power supply input portion 28A is fixed by the shaft portion of the screw 52 being inserted into a through hole of the terminal 28 and screwed in the nut 47. The connector housing 48 has a hood-shaped hood portion 48A and an inner wall 48B that closes the hood portion. The inner wall 48B has a terminal insertion hole 49 which passes through the inner wall 48B and into which the connector terminal 28B is inserted.

A description of a method for manufacturing the circuit assembly 20 is given below.

Surface Roughening Step

The rough surface 36 is formed in the upper surfaces 31A and 33A of the heat dissipation member 30 by performing laser processing, chemical processing, or other processing of the upper surfaces 31A and 33A of the heat dissipation member 30 (FIG. 3).

Insulating Layer Forming Step

Figure 4:
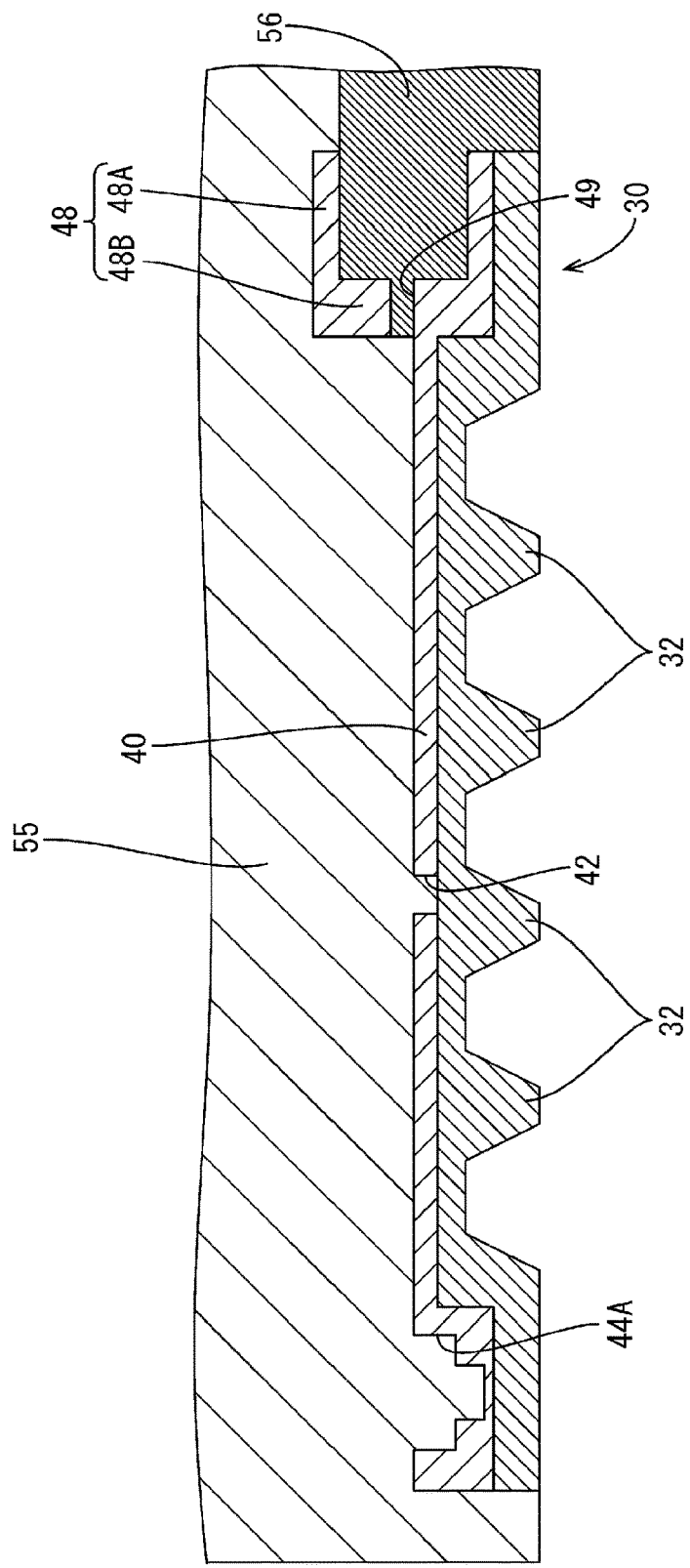
FIG. 4 is a vertical cross-sectional view showing a state in which a resin is filled between a resin-shaping mold and the heat dissipation member.
Figure 6:
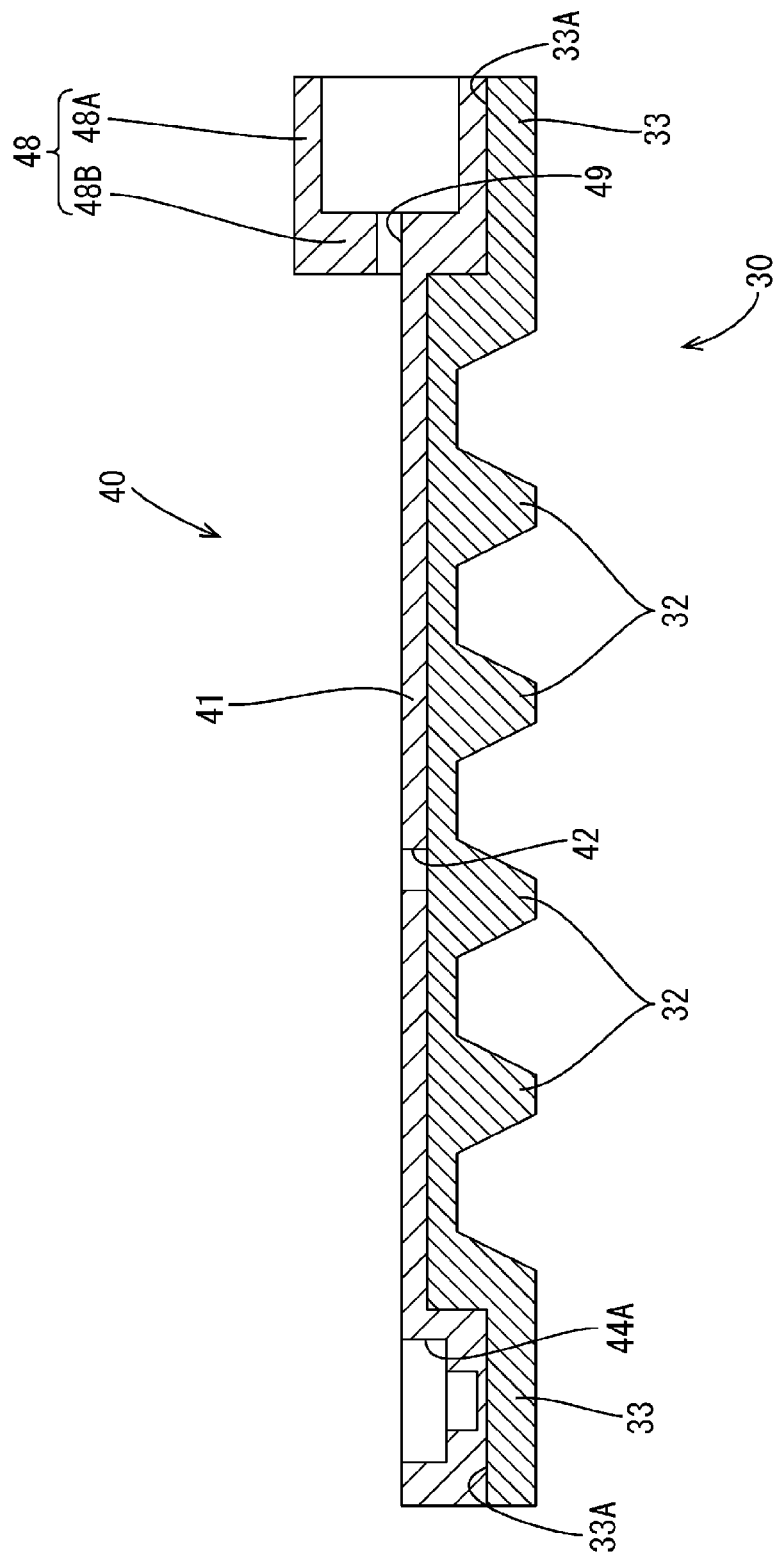
FIG. 6 is a vertical cross-sectional view showing the state in which the insulating layer is formed on the heat dissipation member.

Next, as shown in FIG. 4, resin-shaping molds 55 and 56 are attached, and a resin is injected between the heat dissipation member 30 and the resin-shaping molds 55 and 56. After the resin hardens, thereby forming the insulating layer 40, the resin-shaping molds 55 and 56 are removed. Thus, the insulating layer 40 is secured on top of the heat dissipation member 30 (FIG. 6).

Board Forming Step

Figure 7:
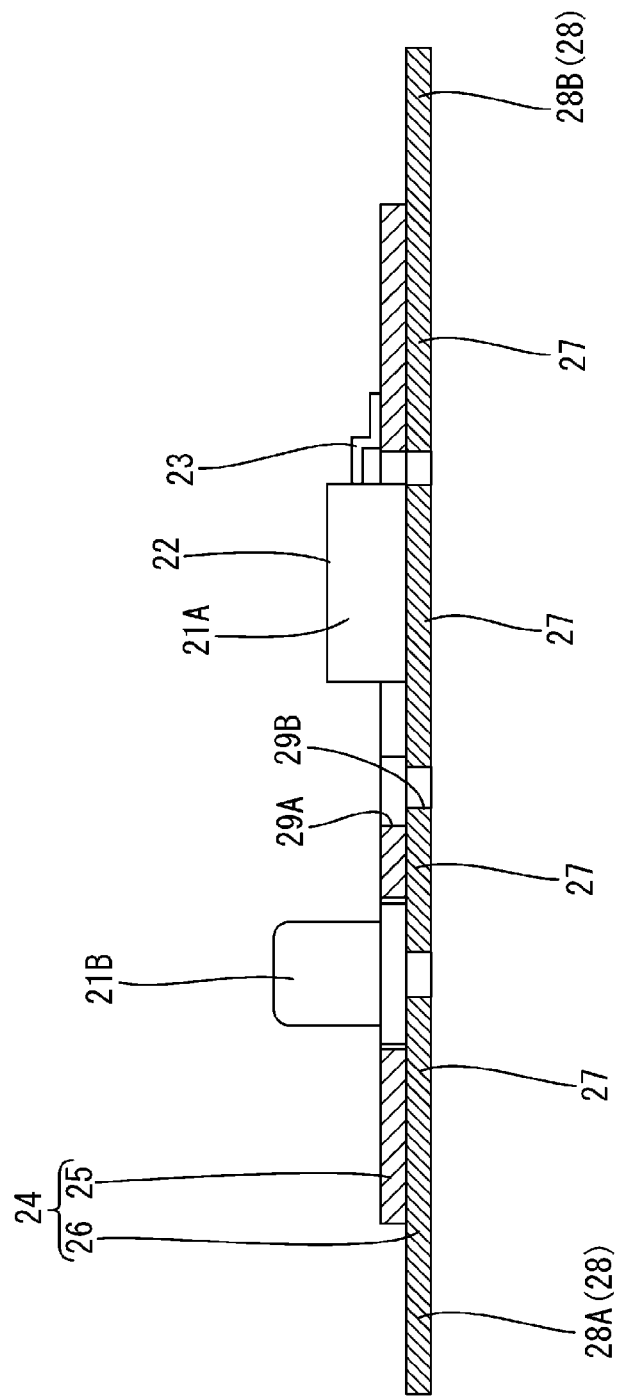
FIG. 7 is a vertical cross-sectional view showing a state in which electronic components are mounted on a circuit board.

The busbar board 26 is formed by punching a metal plate material, and the insulating board 25 and the busbar board 26 are bonded to each other using the adhesive member to form the circuit board 24. Moreover, the electronic components 21A and 21B are mounted on the circuit board 24 by joining the conductive paths of the circuit board 24 to the lead terminals 23 of the electronic components 21A and 21B by reflow soldering, for example (FIG. 7).

Board Assembling Step

Next, the heat dissipation grease 50 is applied to a portion of the upper surfaces 31A and 33A of the heat dissipation member 30, the portion containing the region of the high-heat generating component 21A. The connector terminal 28 of the circuit board 24 is laterally inserted into the terminal insertion hole 49, and the circuit board 24 is slid and positioned on the insulating layer 40. Then, the screws 51 are inserted into the respective through holes 25A and 27A and screwed in the respective fastening holes 43. As a result, the insulating layer 40 is sandwiched between the circuit board 24 and the heat dissipation member 30. Moreover, the coil, which is not shown, is fitted into the fitting recess 33B, and end portions of the winding of the coil are fastened to the terminals 28 with the screws. Thus, the circuit assembly 20 is formed (FIG. 8).

The case 11 is put over the circuit assembly 20, and then the case 11 is fastened to the heat dissipation member 30 with screws, which are not shown. Thus, the electrical junction box 10 is formed (FIG. 1). The electrical junction box 10 is disposed on a path from a power supply of a vehicle to a load.

According to the above-described embodiment, the following effects are achieved.

According to the present embodiment, as a result of the insulating layer 40 hardening on the rough surface 36 of the heat dissipation member 30, the insulating layer 40 penetrates the protrusions and recessions of the rough surface 36 and is secured on top of the heat dissipation member 30. Since the circuit board 24 is placed and fixed on top of this insulating layer 40, the circuit board 24 and the heat dissipation member 30 can be fixed to each other via the insulating layer 40. Thus, the circuit board 24 and the heat dissipation member 30 can be fixed to each other without using an adhesive, and therefore, unlike a case where bonding is performed by using an adhesive, it is possible to suppress a decrease in the heat dissipation properties that will occur when adhesion of the adhesive between the circuit board 24 and the heat dissipation member 30 is insufficient depending on the location.

Moreover, the rough surface 36 is formed by chemical processing or laser processing.

This enables the formation of a rough surface 36 having enough protrusions and recessions to allow the insulating layer 40 to be secured.

Moreover, the circuit board 24 is fastened to the insulating layer 40 with the screws 51 and 52.

Compared with a case where the circuit board 24 is directly fastened to the heat dissipation member 30 with screws, the screws 51 and 52 can be made smaller, and the stress that will be produced in the circuit board 24 during fastening with the screws can be reduced. Thus, it is possible to suppress a soldering defect that will occur due to the stress during fastening with the screws working on a soldered portion.

Moreover, the fastening portions 44A and 44B for fastening of the terminals 28 of the circuit board 24 with the screws are formed in the insulating layer 40.

With this configuration, since the fastening portions 44A and 44B, which need insulating properties, are formed in the insulating layer 40, the number of components can be reduced when compared with a case where the fastening portions 44A and 44B are formed as separate components.

Moreover, the connector housing 48, in which the connector terminal 28B (terminal) of the circuit board 24 is accommodated, is formed in the insulating layer 40.

With this configuration, since the connector housing 48, which needs insulating properties, is formed in the insulating layer 40, the number of components can be reduced when compared with a case where the connector housing 48 is formed as a separate component.

Moreover, the plurality of electronic components constituted by a plurality of said low-heat generating components 21B and a plurality of said high-heat generating components 21A that generate more heat than the plurality of low-heat generating components 21B are mounted on the circuit board 24, and the heat insulating grooves 29A, 29B, and 75, which pass through the circuit board 24 and the insulating layer 40, are formed in the circuit board 24 and the insulating layer 40 at a location between the plurality of low-heat generating components 21B and the plurality of high-heat generating components 21A.

With this configuration, heat transfer from the high-heat generating components 21A to the low-heat generating components 21B side via the circuit board 24 and the insulating layer 40 can be suppressed by the heat insulating grooves 29A, 29B, and 75.

Moreover, the heat dissipation grease 50 is disposed in a region which is located between the circuit board 24 and the insulating layer 40 and over which at least one of the plurality of high-heat generating components 21A is disposed.

With this configuration, the heat dissipation grease 50 can increase heat conductivity between the circuit board 24 and the insulating layer 40. Thus, heat of the high-heat generating components 21A can be efficiently conducted to the heat dissipation member 30.

Embodiment 2

Embodiment 2 will be described with reference to FIGS. 9 to 12. In an electrical junction box 60 and a circuit assembly 61 of Embodiment 2, a heat dissipation member 63 is disposed on the high-heat generating components 21A side of the circuit board 24, whereas no heat dissipation member is disposed on the low-heat generating components 21B side. The same constituent elements as those of Embodiment 1 are denoted by the same reference numerals, and their further description is omitted.

Figure 9:
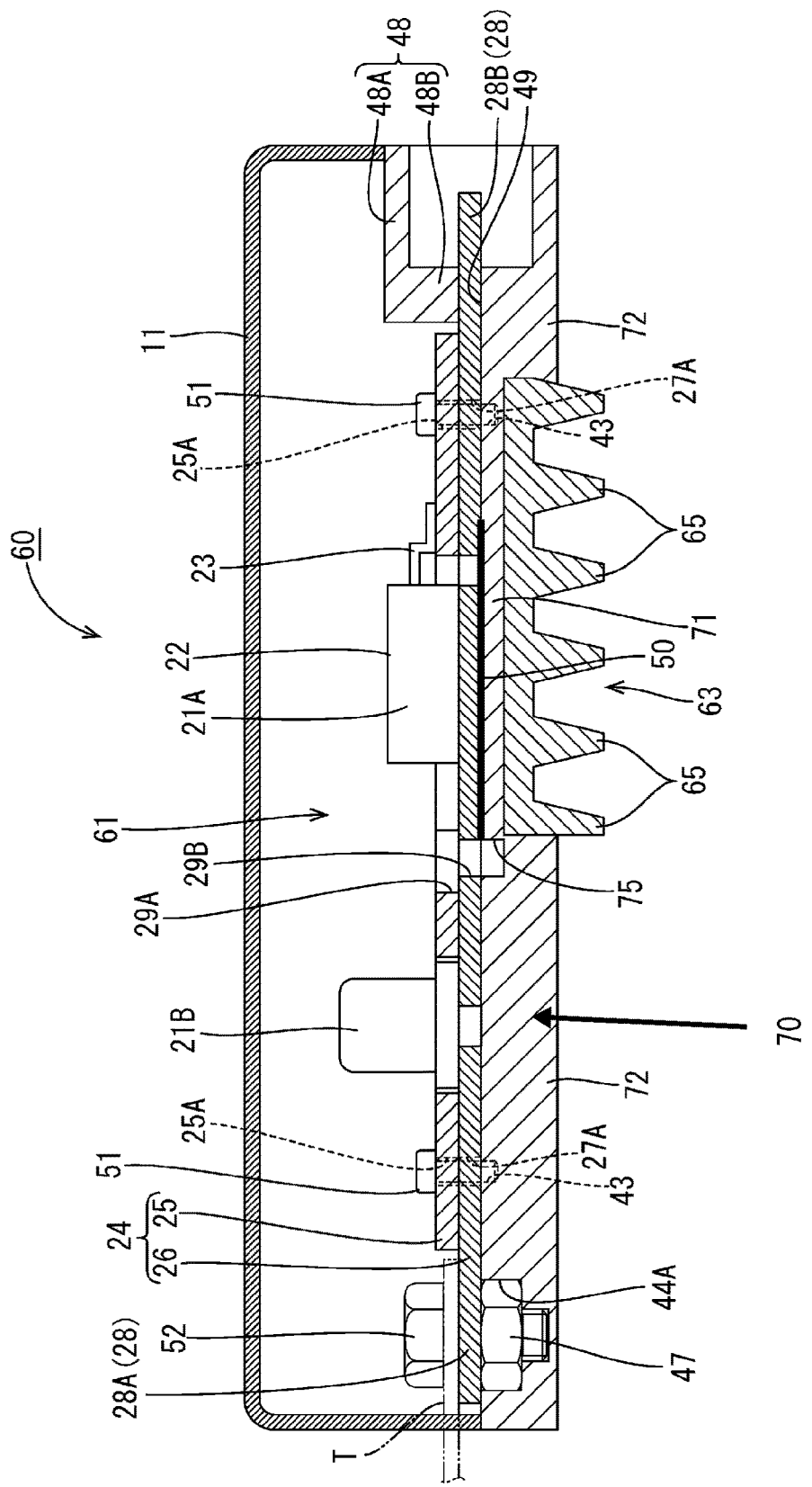
FIG. 9 is a vertical cross-sectional view showing an electrical junction box of Embodiment 2.

As shown in FIG. 9, the circuit board 24 and the case 11 are the same as those of Embodiment 1. Note that when the case 11 is made of metal, a region which is on a bottom surface side of an insulating layer 70 and in which no heat dissipation member is present may be covered with metal to provide shielding properties.

The heat dissipation member 63 is made of a metal having high heat conductivity, such as aluminum or an aluminum alloy, is shaped through aluminum die casting or the like, and has a flat upper surface and a plurality of heat dissipation fins 65 that are lined up like comb teeth on a lower surface side. The size of the heat dissipation member 63 is such that the heat dissipation member 63 can be placed underneath a region of the circuit board 24 that is located on the high-heat generating components 21A side, and the length of the heat dissipation member 63 in the left-right direction in FIG. 9 is about half the length of the heat dissipation member 30 of Embodiment 1. As in the case of Embodiment 1, the upper surface of the heat dissipation member 63 is a rough surface 36 that is formed to be rough, having a large number of protrusions and recessions over the entire surface.

The insulating layer 70 is formed by curing a resin in viscous or liquid form, and includes a plate-shaped main insulating portion 71 that is formed on the rough surface 36 of the heat dissipation member 63 and that has a substantially constant thickness, thick portions 72 that are formed to be thicker than the main insulating portion 71, as well as the fastening portions 44A and 44B and the connector housing 48 that are formed in the thick portions 72. A heat insulating groove 75 is recessed in the upper surface of the main insulating portion 71 at a location between the high-heat generating components 21A and the low-heat generating components 21B. The heat insulating groove 75 is formed at a position that is underneath and continuous with the heat insulating grooves 29A and 29B.

Figure 10:
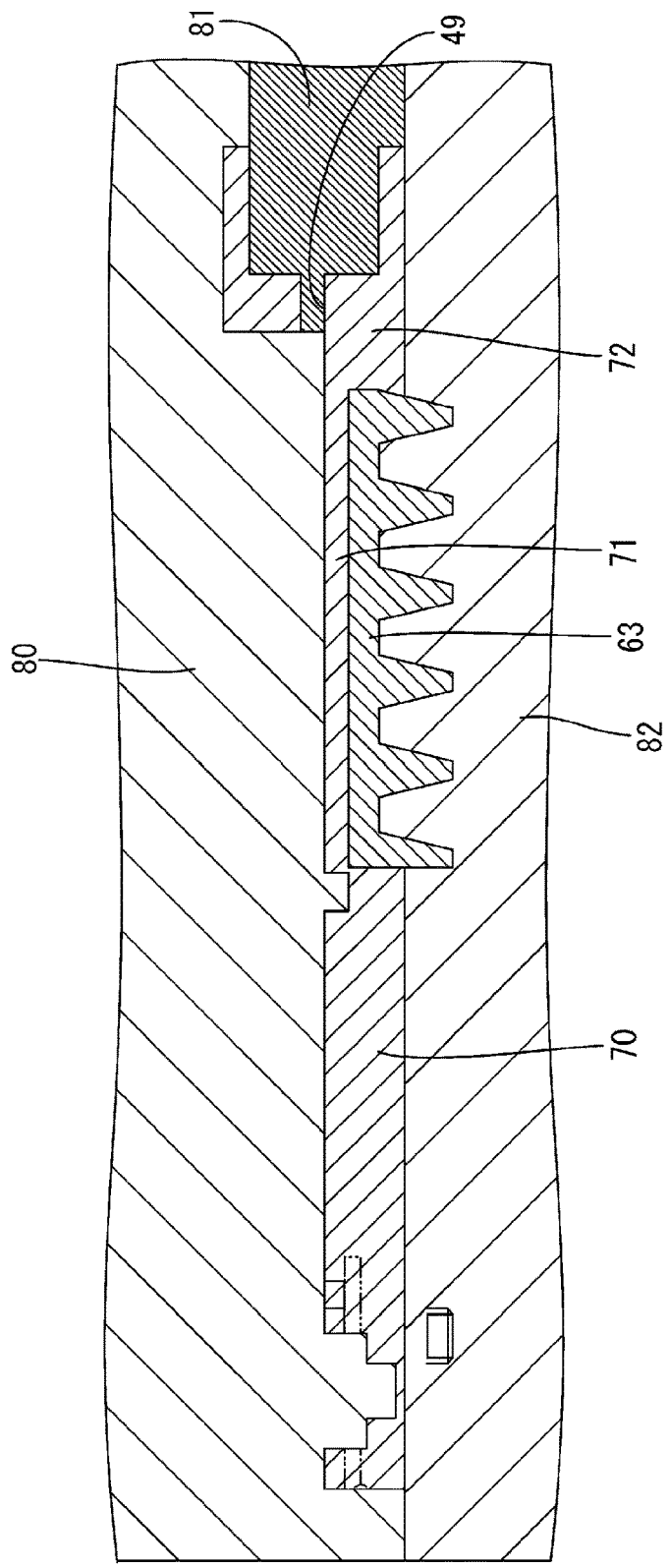
FIG. 10 is a vertical cross-sectional view showing a state in which a resin is filled between a resin-shaping mold and a heat dissipation member.
Figure 11:
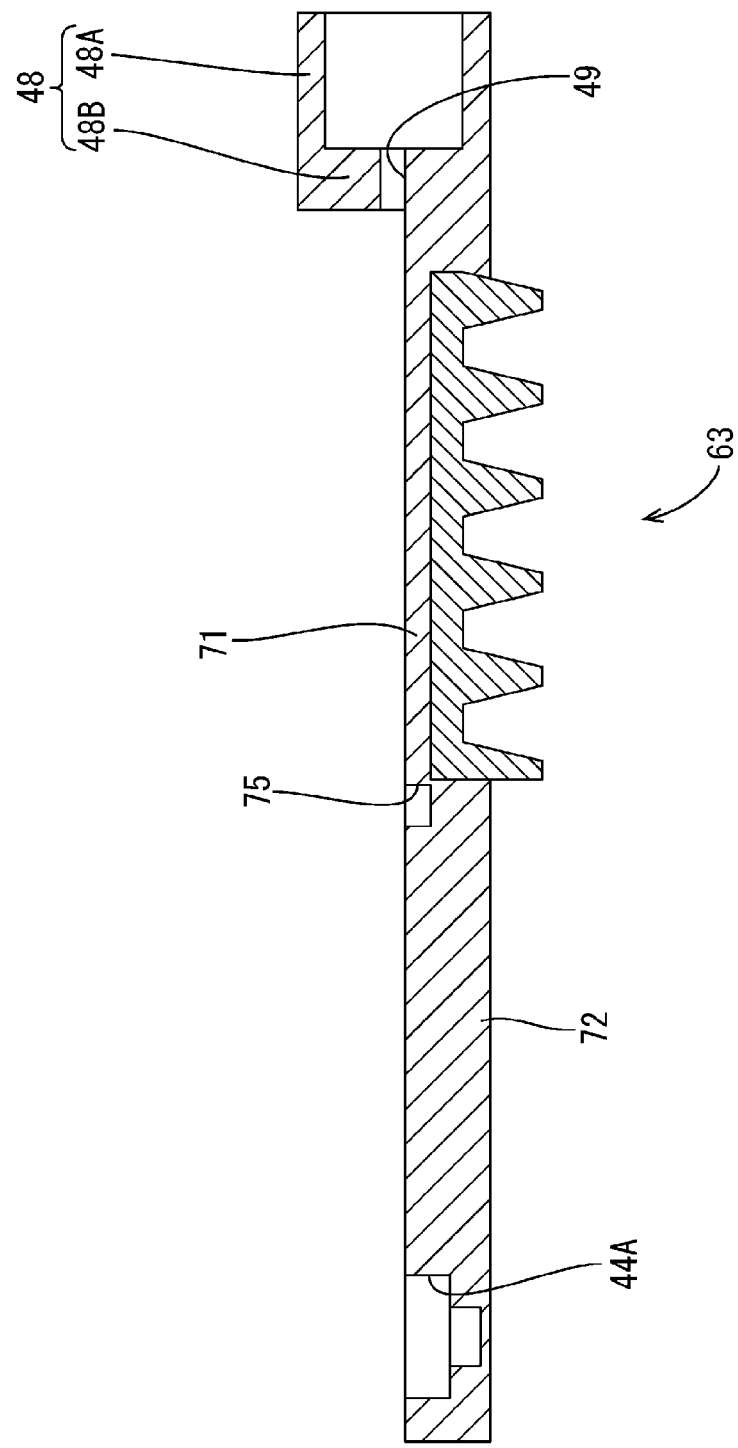
FIG. 11 is a vertical cross-sectional view showing a state in which an insulating layer is formed on the heat dissipation member.
Figure 12:
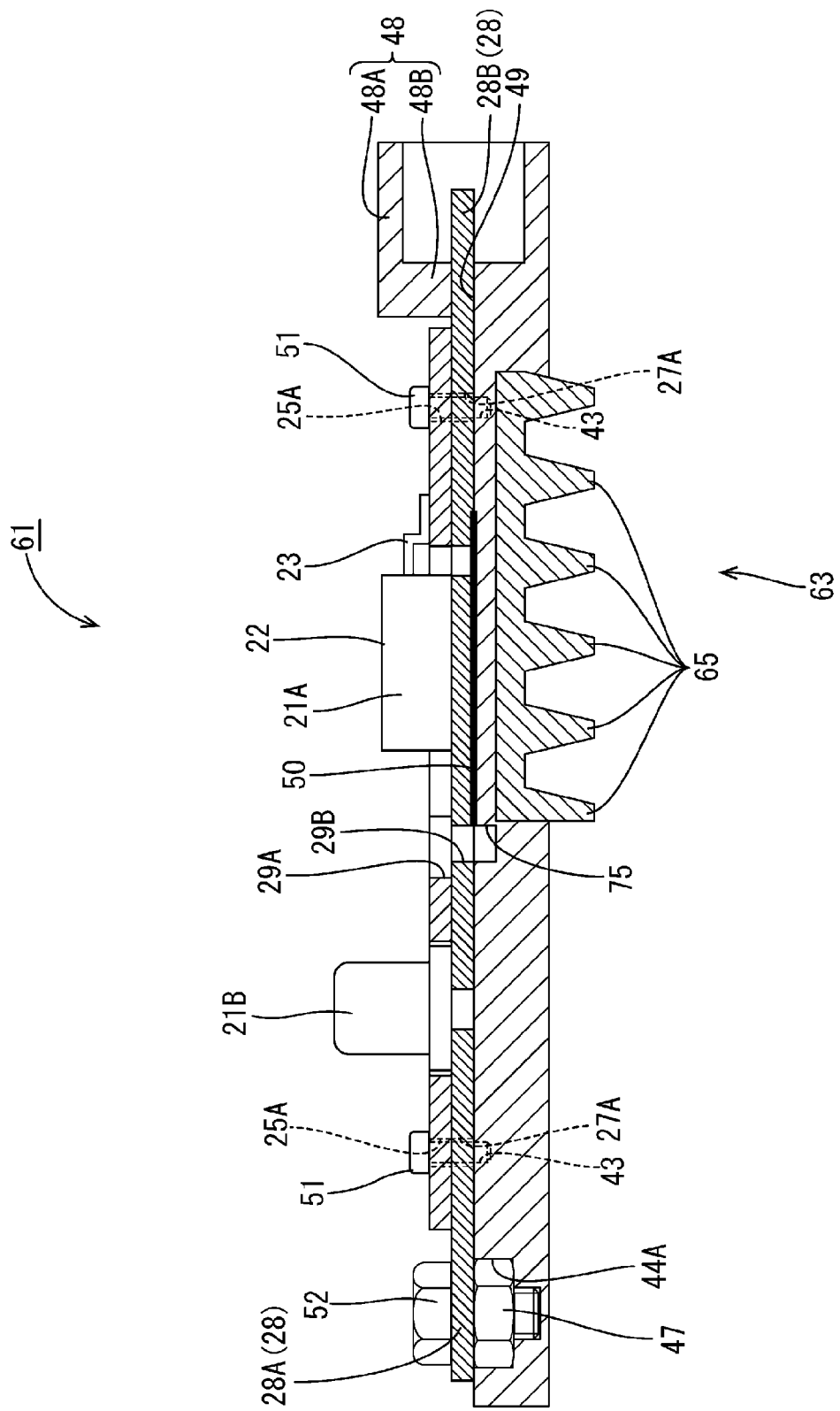
FIG. 12 is a vertical cross-sectional view showing a circuit assembly.

The insulating layer 70 is formed in the following manner. The rough surface 36 is formed by performing laser processing, chemical processing, or other processing of the upper surface of the heat dissipation member 63, and as shown in FIG. 10, the heat dissipation member 63 is held inside resin-shaping molds 80 to 82, and a resin is injected into the inside of the resin-shaping molds 80 to 82. After the resin hardens, thereby forming the insulating layer 70, the resin-shaping molds 80 to 82 are removed. Thus, the insulating layer 70 is secured on top of the heat dissipation member 63 (FIG. 11).

According to Embodiment 2, the heat dissipation member 63 is formed in the region in which the plurality of high-heat generating components 21A are mounted, without overlapping the region in which the plurality of low-heat generating components 21B are mounted. Therefore, the heat dissipation member 63 is made smaller, so that the configuration of the circuit assembly 61 can be simplified. Also, heat of the region that is located on the high-heat generating components 21A side, where a large amount of heat is generated, can be dissipated from the heat dissipation member 63.

Other Embodiments

The present invention is not limited to the embodiments that have been described above with reference to the drawings, and embodiments such as those described below, for example, are also included in the technical scope of the present invention.

(1) Although the rough surface 36 is formed over the entire region where the insulating layer 40 or 70 is formed, the present invention is not limited to this configuration. The rough surface 36 may also be formed in a portion of the region where the insulating layer 40 or 70 is formed.

(2) The rough surface 36 may have various shapes as long as a large number of protrusions and recessions that are enough to allow the insulating layer 40 or 70 to be secured are formed. Also, the method for forming the rough surface is not limited to the methods described in the foregoing embodiments.

(3) Although a configuration in which the heat dissipation grease 50 is disposed over the entire region of a given electronic component 21A has been described above, the present invention is not limited to this configuration. For example, the heat dissipation grease 50 may also be disposed in at least a portion of the region of the electronic component 21A.

The invention claimed is:

1. A circuit assembly comprising:
a circuit board having a conductive path;
a heat dissipation member on which the circuit board is placed; and
an insulating layer that is interposed between the circuit board and the heat dissipation member,
wherein a surface of the heat dissipation member that faces the circuit board is a rough surface having protrusions and recessions, and
the circuit board and the heat dissipation member are fixed to each other by the insulating layer penetrating the protrusions and recessions of the rough surface; and
a plurality of low-heat generating components and a plurality of high-heat generating components that generate more heat than the plurality of low-heat generating components are mounted on the circuit board, and
a heat insulating groove is formed in the circuit board and the insulating layer at a location between the plurality of low-heat generating components and the plurality of high-heat generating components, the heat insulating groove passing through the circuit board and the insulating layer.

2. The circuit assembly according to claim 1, wherein the rough surface is formed by chemical processing or laser processing.

3. The circuit assembly according to claim 1, wherein the circuit board is fastened to the insulating layer with a fixing member.

4. The circuit assembly according to claim 3, wherein a fixed portion for fixation of a terminal of the circuit board with the fixing member is formed in the insulating layer.

5. The circuit assembly according to claim 1, wherein a connector housing in which a terminal of the circuit board is accommodated is formed in the insulating layer.

6. The circuit assembly according to claim 1, wherein a heat dissipation grease is disposed in a region which is located between the circuit board and the insulating layer and over which at least one of the plurality of high-heat generating components is disposed.

7. The circuit assembly according to claim 1, wherein the heat dissipation member is formed in a region in which the plurality of high-heat generating components are mounted, without overlapping a region in which the plurality of low-heat generating components are mounted.

8. An electrical junction box comprising the circuit assembly according to claim 1 and a case that accommodates the circuit assembly.

9. A circuit assembly comprising:
a circuit board having a conductive path;
a heat dissipation member on which the circuit board is placed; and
an insulating layer that is interposed between the circuit board and the heat dissipation member,
wherein a surface of the heat dissipation member that faces the circuit board is a rough surface having protrusions and recessions, and
the circuit board and the heat dissipation member are fixed to each other by the insulating layer penetrating the protrusions and recessions of the rough surface, wherein the protrusions are wider at a leading end side than at a base end side.

* * * * *